(12) United States Patent
Restrepo et al.

(10) Patent No.: US 8,766,821 B2
(45) Date of Patent: Jul. 1, 2014

(54) CIRCUIT PROTECTION FOR CONNECTOR OF GROUNDED AIRCRAFT

(75) Inventors: Carlos Eduardo Restrepo, Atlanta, GA (US); Luis F. Salas, Fayetteville, GA (US)

(73) Assignee: Cooper Technologies Company, Houston, TX (US)

( * ) Notice: Subject to any disclaimer, the term of this patent is extended or adjusted under 35 U.S.C. 154(b) by 209 days.

(21) Appl. No.: 13/446,313

(22) Filed: Apr. 13, 2012

(65) Prior Publication Data

US 2013/0271298 A1  Oct. 17, 2013

(51) Int. Cl.
*G08B 21/00* (2006.01)

(52) U.S. Cl.
USPC ...... 340/945; 340/635; 340/636.13; 340/657; 340/664

(58) Field of Classification Search
USPC ............. 340/945, 635, 636.13, 657, 664
See application file for complete search history.

(56) References Cited

U.S. PATENT DOCUMENTS

| 5,637,863 A | 6/1997 | Sanborn et al. |
| 6,278,381 B1 * | 8/2001 | Bogert .................... 340/945 |
| 2005/0121602 A1 | 6/2005 | Peng et al. |

\* cited by examiner

*Primary Examiner* — Travis Hunnings
(74) *Attorney, Agent, or Firm* — King & Spalding LLP

(57) ABSTRACT

A protection system is described herein for an electrical connector providing power to a grounded aircraft. The system includes receiving a sensing device electrically coupled to each of a number of power conductors. The sensing device generates an operating parameter. The system also includes a protection device that measures the operating parameter, determines that the operating parameter exceeds a threshold, and sends an overcurrent notification. The system may also include a shunt that is electrically coupled to the power conductors and generates a different operating parameter. The protection device may determine a difference between operating parameters of the shunt and sensing device and send an overtemperature notification when the difference exceeds an operating threshold. The system may also include a ground fault detection device. Some or all components of the system may be located in a removable adapter.

27 Claims, 11 Drawing Sheets

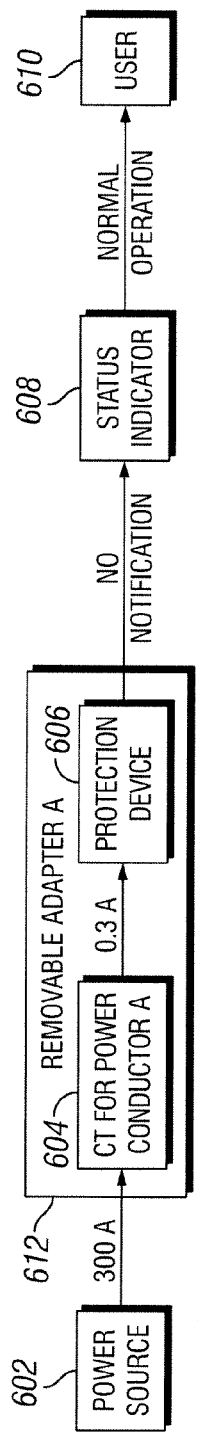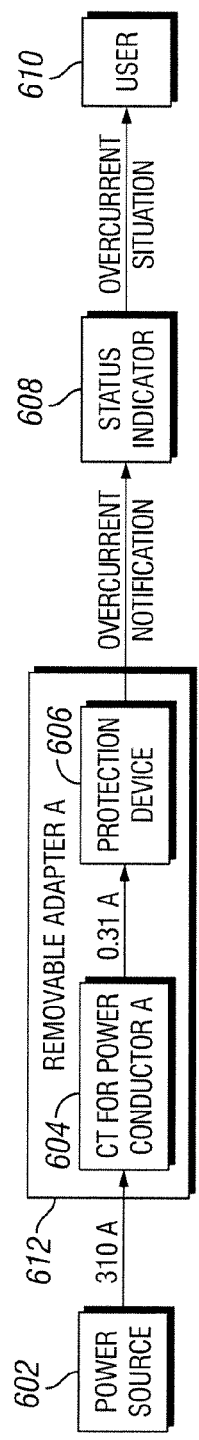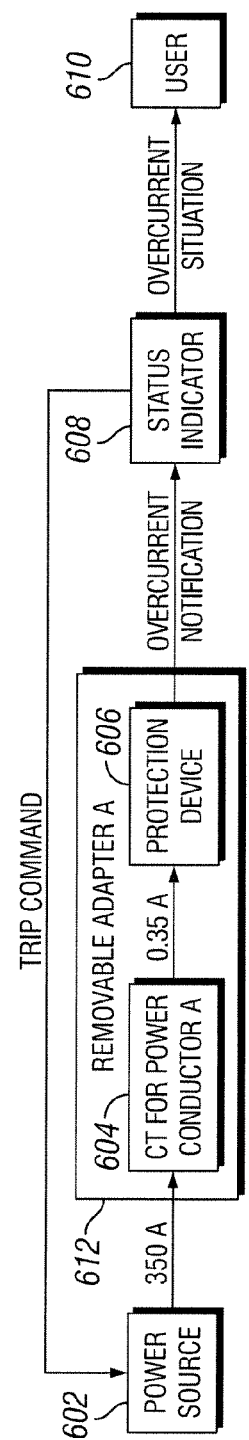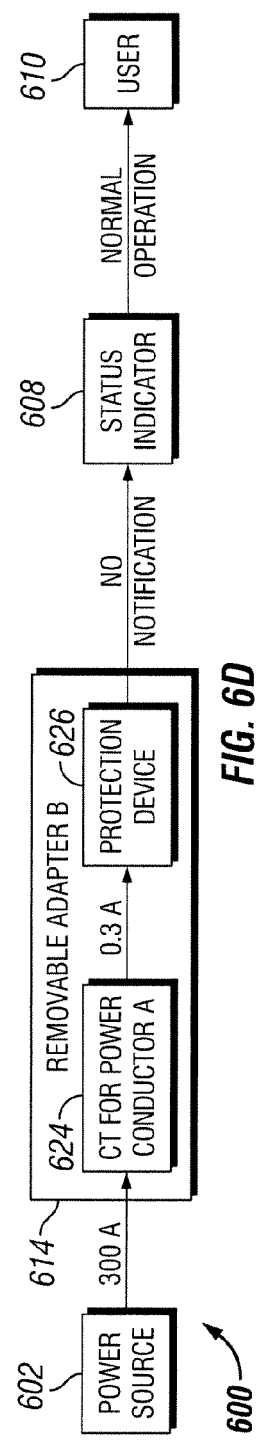
FIG. 6A
FIG. 6B
FIG. 6C
FIG. 6D

CIRCUIT PROTECTION FOR CONNECTOR OF GROUNDED AIRCRAFT

TECHNICAL FIELD

The present disclosure relates generally to an electrical plug connector and more particularly to systems, methods, and devices for providing circuit protection for an electrical connector providing power to a grounded aircraft.

BACKGROUND

When an aircraft is sitting on the ground (as at a terminal gate at an airport), power sometimes is needed onboard the aircraft. For example, a grounded aircraft may need power to run a heating, ventilation, and air conditioning system to control the climate inside the aircraft or to provide lighting inside of the aircraft. Additionally, a grounded aircraft may need power so that instrumentation may be tested and/or operated.

A number of aircraft have an electrical terminal located on the outer body of the aircraft. This terminal is designed to receive an electrical connector (also referred to as a plug) that supplies power through a cable having multiple conductors. The connector typically includes a number of pins or terminals, one for each conductor in the cable. As the connector is plugged into and unplugged from the receiving terminal on the outer body of the grounded aircraft a number of times, the pins and/or conductors can become loose. In such a case, one or more unsafe electrical conditions may arise. For example, an overcurrent situation may develop, causing a potential fire hazard from increased temperatures resulting from the overcurrent operation. As another example, a ground fault may occur, causing an electrical short which can damage equipment on the grounded aircraft as well as equipment on neighboring electrical circuits.

SUMMARY

In general, in one aspect, the disclosure relates to a protection system for an electrical connector providing power to a grounded aircraft. The protection system can include a plug housing having an interior cavity. The protection system can also include a sensing device disposed within the interior cavity and electrically coupled to each of a number of power conductors, where the power conductors include a first power phase and where the sensing device generates, based on a first operating parameter of at least one of the power conductors, a second operating parameter that is smaller than the first operating parameter. The protection system can also include a protection device disposed within the interior cavity and having a first signal conditioner measuring, for at least one of the power conductors, the second operating parameter generated by the sensing device and logic determining whether the second operating parameter of at least one of the plurality of power conductors exceeds a current threshold.

In another aspect, the disclosure can generally relate to a ground fault detection system for an electrical connector providing power to a grounded aircraft. The ground fault detection system can include a plug housing having an interior cavity. The ground fault detection system can also include a sensing device disposed within the interior cavity and electrically coupled to a number of power conductors, where the power conductors include a first power phase, a second power phase, a third power phase, and a neutral line, and where the sensing device generates, based on a first operating parameter of the power conductors, a second operating parameter that is smaller than the first operating parameter. The ground fault detection system can also include a ground fault detection device having a signal conditioner measuring the second operating parameter generated by the sensing device and logic determining whether the second operating parameter exceeds a ground fault threshold.

In yet another aspect, the disclosure can generally relate to a method of detecting an overcurrent condition in an electrical connector providing power to a grounded aircraft. The method can include receiving a first operating parameter for at least one of a number of power conductors and generating a second operating parameter based on the first operating parameter. The method can also include measuring, for at least one of the power conductors, the second operating parameter and determining whether the second operating parameter exceeds a current threshold.

In still another aspect, the disclosure can generally relate to a method of detecting a ground fault of an electrical connector providing power to a grounded aircraft. The method can include generating, based on a first operating parameter of each of a number of power conductors, a second operating parameter that is proportionately smaller than the first operating parameter by a ratio, where the power conductors include a first power phase, a second power phase, a third power phase, and a neutral line. The method can also include measuring the second operating parameter of each of the power conductors and determining a difference in the second operating parameter for at least two of the power conductors. The method can further include determining that the difference in the second operating parameter for the at least two of the power conductors exceeds a ground fault threshold.

These and other aspects, objects, features, and embodiments will be apparent from the following description and the appended claims.

BRIEF DESCRIPTION OF THE DRAWINGS

The drawings illustrate only exemplary embodiments and are therefore not to be considered limiting of its scope, as the exemplary embodiments may admit to other equally effective embodiments. The elements and features shown in the drawings are not necessarily to scale, emphasis instead being placed upon clearly illustrating the principles of the exemplary embodiments. Additionally, certain dimensions or positionings may be exaggerated to help visually convey such principles. In the drawings, reference numerals designate like or corresponding, but not necessarily identical, elements.

FIGS. 6A-D present various examples of a system for protecting an electrical connector providing power to a grounded aircraft from an overcurrent situation in accordance with one or more exemplary embodiments.

DETAILED DESCRIPTION OF EXEMPLARY EMBODIMENTS

Figure 1A:
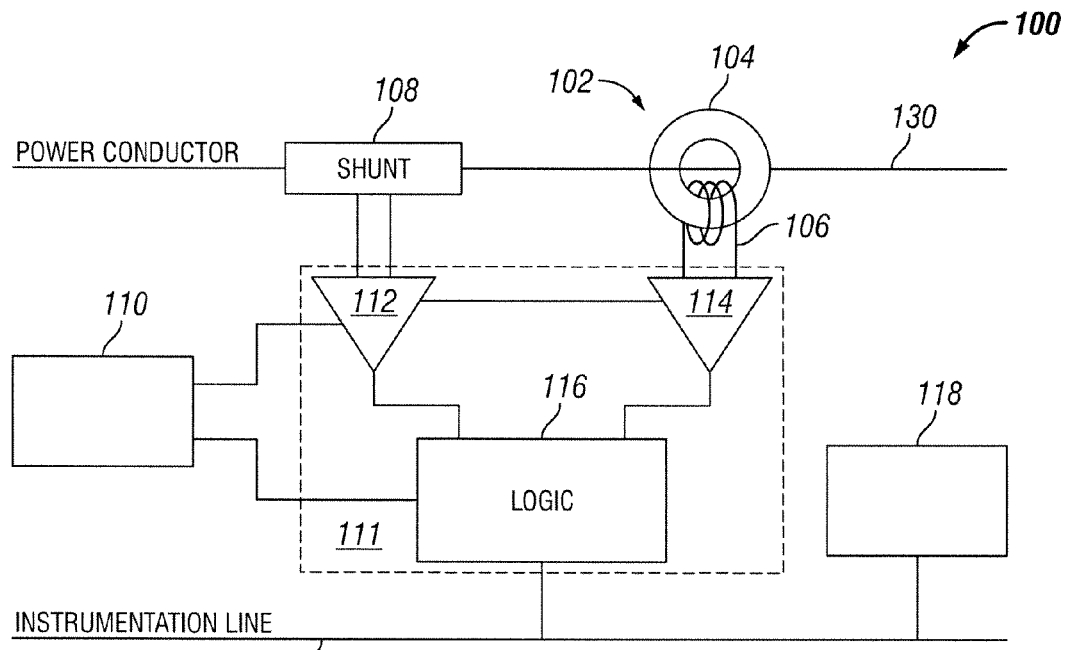
FIG. 1A shows a system for overcurrent and temperature protection in accordance with one or more exemplary embodiments.

Exemplary embodiments will now be described in detail with reference to the accompanying figures. Like, but not necessarily identical, elements in the various figures are denoted by like reference numerals for consistency. In the following detailed description of the exemplary embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, the exemplary embodiments described herein provide systems, methods, and devices for providing circuit protection for connectors of grounded aircraft. More specifically, the exemplary embodiments provide for overcurrent, overtemperture, and/or ground fault protection for an electrical connector providing power to a grounded aircraft. In one or more exemplary embodiments, a grounded aircraft is an aircraft that is parked and immobile on the ground, as at an airport terminal or in a hangar. While the exemplary embodiments discussed herein are with reference to the use of circuit protection for connectors of grounded aircraft, the systems, methods, and devices can also be incorporated into electrical connectors for other objects that require power when not in a normal operating state. Examples of such other objects may include, but are not limited to, an electric car, an electric lawn mower, a boat, a shipping vessel, and a rig for a semi-truck.

Exemplary embodiments may prevent one or more electrical conditions from occurring or from getting worse. One such electrical condition is an overcurrent condition. In one exemplary embodiment, an overcurrent condition is where one or more conductors transmitting power through the electrical connector to the grounded aircraft carries a current that is too high (i.e., has too many amperes). For example, if a threshold current is 320 Amperes (A) and the current flowing through a conductor is 330 A, then an overcurrent situation exists. An overcurrent situation may also be caused by one or more of a number of other conditions, including but not limited to excessive power demand by the load, internal dielectric degradation, and/or an internal short circuit in the electrical connector.

Another such electrical condition is an overtemperature condition. In one exemplary embodiment, an overtemperature condition occurs when one or more conductors heat to a temperature beyond a safe operating temperature. The temperature may be measured directly (for example, using a thermocouple) or indirectly (as described in more detail below). For example, if a threshold operating temperature is 120° F., and if the temperature of a conductor is 125° F., then an overtemperature situation exists. An overtemperature situation may also be caused by poor contact connections between one or more male pins in the electrical connector and the corresponding connector on the grounded aircraft.

Another such electrical condition is a ground fault. In one exemplary embodiment, a ground fault occurs when a current imbalance between all current-carrying conductors and a neutral conductor exceeds a threshold. Typically, the threshold is slightly greater than zero. For example, if the ground fault threshold is 30 mA, and if the differential between a conductor and ground is 33 mA, then a ground fault exists.

Yet another such electrical condition is a high current differential. For example, with a high current differential, the current flowing through one conductor (not including ground) may also be too high when compared to the current flowing through a different conductor (not including ground). In such a case, when the differential exceeds a threshold, a hazardous condition may result.

A fault caused by one or more of the above electrical conditions (e.g., overcurrent, ground fault, overtemperature) may result in damage to equipment. For example, a surge of electricity can short out and permanently damage electronics (e.g., circuit boards, processors, discrete components, the electrical connector and/or the cable coupled to the electrical connector). In some cases, a fire and/or explosion may result, causing damage to mechanical equipment and, potentially, harm to human health and safety. The situation can be especially dangerous for personnel working inside and/or around the grounded aircraft. Most particularly, the person responsible for plugging the connector into and unplugging the connector from the grounded aircraft may be exposed to danger if any of the aforementioned electrical conditions are allowed to exist.

In one or more exemplary embodiments, a user is any entity that uses the systems and/or methods described herein. For example, a user may be, but is not limited to, a maintenance worker, a pilot, a security professional, a contractor, an engineer, or a supervisor.

FIG. 1A shows a diagram of a system 100 for overcurrent and temperature protection in accordance with one or more exemplary embodiments. The exemplary system 100 includes a sensing device 102, a shunt 108, a protection device 111, a power supply 110, a status indicator 118, an instrumentation line 120, and one or more power conductors 130. Each of these components is described below. Embodiments of the invention are not limited to the configuration shown in FIG. 1A and discussed herein.

In one or more exemplary embodiments, the one or more power conductors 130 carry voltage and/or current from one end of the power conductor 130 to the other end of the power conductor 130. The power conductor 130 may be among a number of power conductors in a cable. In one or more exemplary embodiments, the power conductor 130 includes a ground or neutral conductor, through which no current or voltage flows. Each power conductor 130 may be of any suitable size (e.g., 12 American Wire Gauge (AWG)) and made of one or more of a number of materials (e.g., copper, aluminum). Each power conductor 130 may be coated with an insulator made of any suitable material (e.g., rubber, plastic) to keep the power conductor 130 electrically isolated from any other conductor.

The power flowing through each power conductor 130 may be in alternating current (AC) form or direct current (DC) form. When the power is in AC form, there may be two power conductors (one for a single phase and one for the neutral line), or three power conductors (two for a power phase and one for the neutral line), or four power conductors (three for each power phase and one for the neutral line). For AC power, the voltage and/or current flowing through a power conductor 130 may be referred to as a power phase.

In exemplary embodiments, the sensing device 102 is any device that generates a representation of an operating parameter (e.g., voltage, current, resistance) of one or more power conductors 130 and/or one or more instrumentation lines 120. The exemplary sensing device 102 is coupled (e.g., electrically, magnetically, communicably) to a single conductor 130 and/or an instrumentation line 120 and the protection device 111. For example, the sensing device 102 may be magnetically coupled to the conductor 130 and/or an instrumentation line 120, and electrically coupled to (capable of sending and receiving signals with respect to) the protection device 111. The representation of the operating parameter may be an electrical signal (e.g., analog signal, digital signal), an electro-mechanical signal, and/or any other suitable signal. The representation of the operating parameter may be a fractional amount of (proportionately smaller than) the operating parameter. The difference between the operating parameter and the representation of the operating parameter may be defined by a ratio. In one exemplary embodiment, the representation of the operating parameter is sent by the sensing device 102 to the protection device 111 (described below).

For example, when the sensing device 102 is a current transformer, as shown in the example in FIG. 1A, the current transformer includes a primary winding 104 and a secondary winding 106. The primary winding 104 and the secondary winding 106 typically have a known ratio (e.g., 4000:5). As a result, the secondary winding 106 generates a representation of the operating parameter that is 800 times less than the operating parameter. For example, if the current (an operating parameter) that flows through (and/or is measured by) the primary winding 104 through the power conductor 130 is 300 A, then the representation of the current (a different operating parameter) generated by the secondary winding 106 is 0.375 A.

The sensing device 102 may also be capable of measuring an operating parameter of one or more power conductors 130 and/or instrumentation lines 120, independently of each power conductor 130 and/or an instrumentation line 120. The exemplary sensing device 102 may be one or more of a number of other measurement devices and/or transducers, including, but not limited to, a Hall effect sensor, a potential transformer (also called a voltage transformer), an antenna, and an electrometer. A potential transformer has similar characteristics to the current transformer, except the operating parameter detected by the potential transformer, as well as the representation of the operating parameter generated by the potential transformer, is a voltage. A Hall effect sensor may be used to receive and/or generate current representative of the current flowing through the power conductors 130.

For purposes of overtemperature detection, the system 100 includes a shunt 108 (also called a current shunt). The shunt 108 is a segment of a known material (e.g., a metal) having a known size (having known dimensions such as length, width, thickness) and with known electrical characteristics, based on the material and size of the shunt 108, over a range of different temperatures. In other words, the shunt 108 may, based on a current flowing through the shunt 108, generate one of a number of different operating parameters (e.g., voltages), which corresponds to one of a range of current and one of a range of temperature. For example, the resistance of the shunt 108 may vary depending on the temperature at which the shunt 108, with the known size and material, is exposed. In such a case, when a current flows through the shunt 108 (of known size and material) and generates a different operating parameter (e.g., a voltage), the temperature of the shunt 108 can be inferred based on a curve, table, or graph comparing the temperature and the different operating parameter for the shunt 108 at the current flowing through the shunt 108.

In one exemplary embodiment, the shunt 108 is electrically coupled to a power conductor 130 and/or an instrumentation line 120 and generates a different operating parameter (e.g., a voltage) that is proportional to the amount of current flowing through shunt 108 (as well as the power conductor 130 and/or an instrumentation line 120). Specifically, an exemplary shunt 108 is physically connected to each power conductor 130 in series and coupled with a sensing device 102. The different operating parameter of the shunt 108 is read by the protection device 111, which may be the same or a different protection device described above with respect to measuring an operating parameter from a sensing device 102.

When one or more shunts 108 are used to generate a different operating parameter proportionate to the current flowing through the shunt 108, such different operating parameter may be compared to the representation of the operating parameter generated by the sensing device 102 to determine whether an overtemperature situation exists on one or more power conductors 130. Specifically, the different operating parameter generated by the shunt 108 is dependent upon the temperature of the shunt material. By contrast, the representation of the operating parameter generated by the sensing device 102 is temperature independent. As a result, the difference between the different operating parameter and the representation of the operating parameter is caused by the temperature of the shunt 108 during conduction, and so comparing the two (performed by the overtemperature device, as described below) leads to a determination as to the temperature of the power conductor 130 while operating.

Alternatively, or in addition, the system 100 may include a temperature measuring device (not shown), such as a thermocouple. The temperature measuring device may be used to directly measure one or more temperatures of one or more components (e.g., a conductor, a shunt 108) of the system 100. In such a case, the temperature sensor can send signals to and receive signals from the protection device 111.

In one or more exemplary embodiments, the protection device 111 measures one or more operating parameters (e.g., current, voltage) received from the shunt 108 and/or the sensing device 102 and determines whether the measurement of the operating parameter exceeds a threshold value. The protection device 111 may include logic 116 and one or more signal conditioners (e.g., signal conditioner A 112, signal conditioner B 114). The components of the exemplary protection device 111 (e.g., the logic 116, signal conditioner A 112, signal conditioner B 114) may be discrete components and/or integrated into a single device. Further, the protection device 111 may include hardware and/or software and may be a computing device, as described below with respect to FIG. 5.

In certain exemplary embodiments, each of the signal conditioners 112, 114 measures, for each of the power conductors, the representation of the operating parameter generated by a sensing device 102, the different operating parameter generated by the shunt 108, and/or any other suitable operating parameter generated by any other suitable device (for example, as described below with respect to FIG. 1B).

In certain embodiments, each exemplary signal conditioner 112, 114 can measure a received signal (e.g., the representation of the operating parameter, the different operating parameter). Each signal conditioner 112, 114 can also convert the received signal from one unit of measure (e.g., voltage, current) to a different unit of measure (e.g., current, voltage). Alternatively, the conversion may instead be made by the logic 116 of the protection device 111. Each exemplary signal conditioner 112, 114 also sends each measurement (whether converted or not) to the logic 116.

In one or more exemplary embodiments, the logic 116 of the protection device 111 determines that the representation of the operating parameter generated by the sensing device 102 and/or the different operating parameter generated by the shunt 108 exceeds a threshold. In one exemplary embodiment, a threshold is a limit that is set to indicate an unsafe electrical condition. The threshold may be in one or more of a number of units of measure, including but not limited to amperes, volts, and temperature. The threshold may be set by default, or adjustable, for example, by a user, and/or by any other suitable entity or computer software.

As an example, the logic 116 determines that the representation of the operating parameter generated by the sensing device 102 is 0.4 A, which exceeds the threshold of 0.38 A, and so an overcurrent situation exists on the power conductor 130. As another example, the logic 116 determines that the different operating parameter generated by the shunt 108 is 0.6 V, which does not exceed the threshold of 0.65 V, and so an overtemperature situation does not exist on the power conductor 130.

In certain exemplary embodiments, the protection device 111 and/or one or more components of the protection device 111 use power to operate. The power used by the protection device 111 may be drawn from one or more of a number of sources, including but not limited to a battery, one or more power conductors 130, and one or more instrumentation lines 120. The power used by the protection device 111 may be sourced from inside the protection device 111 or outside the protection device 111. The power used by the protection device 111 may be delivered to the protection device 111 using one or more of a number of ways, including hard wires. For example, the protection device 111 may use power flowing through two instrumentation lines 120 (e.g., instrumentation line E, instrumentation line F), where such power is delivered by two wires (one connected to each instrumentation line 120).

In cases where the representation of the operating parameter for a power conductor 130 is generated by the sensing device 102 and where the different operating parameter for the same power conductor 130 is generated by the shunt 108, the logic 116 determines a difference between the representation of the operating parameter and the different operating parameter. In such a case, the logic 116 determines that the difference between the representation of the operating parameter and the different operating parameter exceeds an operating threshold.

As an example, the logic 116 receives, from signal conditioner A 112, a measurement of 0.3 A from the sensing device 102. The logic 116 also receives, from signal conditioner B 114, a measurement of 0.45 V from the shunt 108. Using these measurements, as well as the size and electrical characteristics of the shunt 108, the logic 116 determines that the temperature of the power conductor 130 is 145° F. If a temperature threshold is 140° F., then the logic 116 determines that the temperature of the power conductor 130 exceeds the temperature threshold.

The logic 116 also, in certain exemplary embodiments, sends a notification that a threshold (e.g., current, temperature, voltage) has been exceeded. The logic 116 can send the notification to a status indicator 118, which is electrically coupled to the protection device 111. In this example, the logic 116 sends the notification based on its determination that an operating parameter exceeds the corresponding threshold. For example, the protection device sends an overcurrent notification to the status indicator 118 using the instrumentation line 120. The exemplary logic 116 may also trip a circuit based on a certain operating condition or situation. In other words, instead of (or in addition to) sending a notification, the logic 116 may trip the associated circuit to prevent further damage from being caused by the operating condition.

The exemplary logic 116 also maintains a number of thresholds for certain operating condition. For example, when monitoring an overcurrent situation, more than one current threshold may be maintained by the logic 116. A lower current threshold (0.031 A) may be used to merely generate an alarm (overcurrent notification), where a higher current threshold (0.033 A) may be used to trip the circuit as well as generate the alarm.

A signal (e.g., notification, trip command) generated by the logic 116 of the protection device 111 is sent using a network of hard wires and/or wireless technology. In one or more exemplary embodiments, the network is any combination of hardware and/or software that allows signals to be sent between the protection device 111 and the status indicator 118. The network may be wireless, hardwired, or any suitable combination thereof. The network may follow one or more communication protocols to allow the signals to be sent between the protection device 111 and the status indicator 118. Examples of such protocols may include, but are not limited to, WI-FI, zigbee, z-wave, 6loWPAN, 900 MHz flex paging, and general packet radio service (GPRS).

One or more components of the protection device 111, as the network and/or the status indicator 118, may be powered by the power supply 110. In certain exemplary embodiments, the power supply 110 provides an appropriate type of power (e.g., AC, DC) and an appropriate level of voltage (e.g., 24V, 9V, 1.5V). The power supply 110 may be a battery and/or a wired source. In addition, the power supply 110 may be separate from, or integrated with, the protection device 111.

The hard wire portions of the network may include one or more instrumentation lines 120 (e.g., instrumentation line E, instrumentation line F). In one or more exemplary embodiments, the one or more instrumentation lines 120 carry signals (lower voltage and/or current) from one end of the instrumentation line 120 to the other end of the instrumentation line 120. The instrumentation line 120 may be among a number of instrumentation lines in a cable. Each instrumentation line 120 may be of any suitable size (e.g., 22 AWG) and made of one or more of a number of materials (e.g., copper, aluminum). Each instrumentation line 120 is smaller (lower gauge) than that of each of the power conductors. Each instrumentation line 120 may be coated with an insulator made of any suitable material (e.g., rubber, plastic) to keep the instrumentation line 120 electrically isolated from any other conductor. Instrumentation line 120 may be a line to drive a relay (a relay line). A different instrumentation line (e.g., instrumentation line F (not shown) may also, or in the alternative, be a line used for remote indication or activating a secondary relay.

In one exemplary embodiment, the status indicator 118 notifies a user that a problem exists with the system 100. For example, the status indicator 118 presents information to the user in one or more forms. In addition, or alternatively, the status indicator 118 may perform one or more actions to alleviate the problem. For example, the status indicator 118 may be one or more of a protective relay, a siren, a window on a warning panel, and a flashing light. The status indicator 118 may be located in one or more of a number of locations, including, but not limited to, at the connection point with the grounded aircraft, inside the grounded aircraft (for example, in the cockpit), or at the source end of the cable providing the power to the grounded aircraft. In certain exemplary embodiments, the status indicator 118 is part of the protection device 111.

Figure 1B:
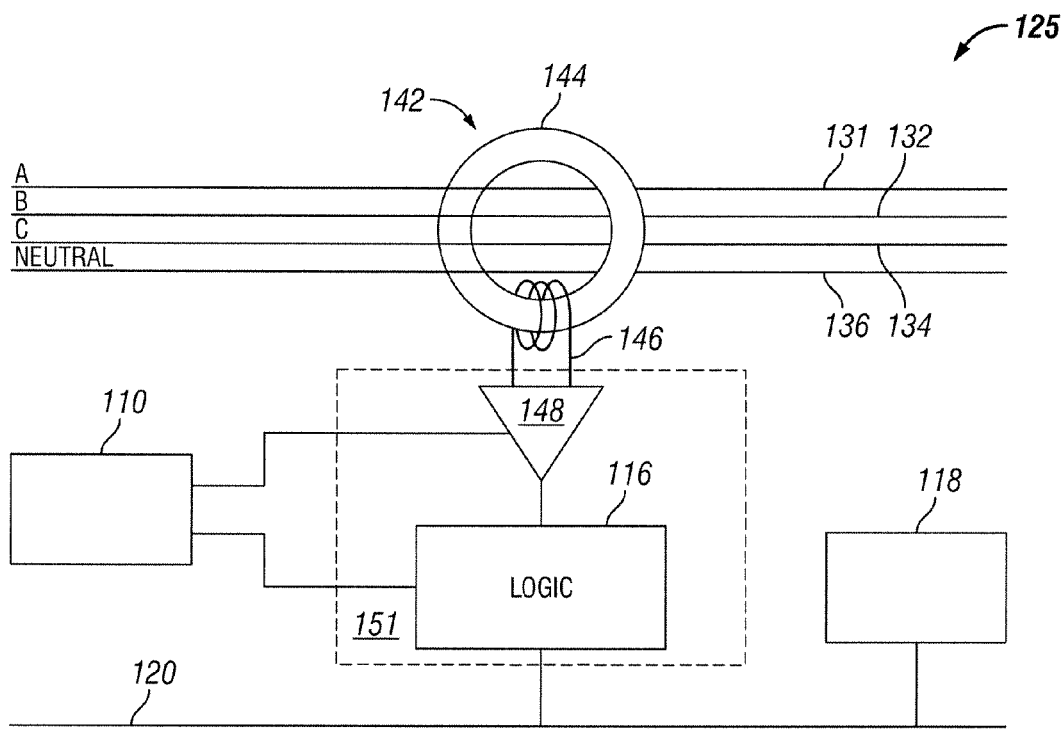
FIG. 1B shows a system for ground fault protection in accordance with one or more exemplary embodiments.

FIG. 1B shows a diagram of a system 125 for ground fault protection in accordance with one or more exemplary embodiments. The exemplary system 125 includes a sensing device 142, a ground fault detection device 151, the power supply 110, the status indicator 118, one or more instrumentation lines 120, and one or more power conductors 130. The ground fault detection device 151 includes a signal conditioner 148 and logic 116. Each of these components is described below. Embodiments of the invention are not limited to the configuration shown in FIG. 1B and discussed herein. The power supply 110, the status indicator 118, the signal conditioner 148, the logic 116, the network, the one or more instrumentation lines 120, and the one or more power conductors 130 are substantially similar to the corresponding components described above with respect to FIG. 1A.

In one exemplary embodiment, the sensing device 142 of the system 125 is any device capable of measuring an operating parameter (e.g., ground fault) of the power conductors 130 (power conductor A 131, power conductor B 132, power conductor C 134, and the neutral line 136). The exemplary sensing device 142 may also generate a representation of the operating parameter of the power conductors 130. The representation of the operating parameter may be a digital signal, an electrical signal, a mechanical signal, and/or any other suitable signal. The representation of the operating parameter may be a fractional amount of (proportionately smaller than) the operating parameter. The difference between the operating parameter and the representation of the operating parameter may be defined by a ratio. In one exemplary embodiment, the representation of the operating parameter is sent by the sensing device 142 to the ground fault detection device 151.

For example, when the sensing device 142 is a differential current transformer, as shown in the example in FIG. 1B, the differential current transformer 142 includes a primary winding 144 and a secondary winding 146. The primary winding 144 and the secondary winding 146 may have a known ratio (e.g., 10:1). As a result, the secondary winding 146 generates a representation of the operating parameter that is 10 times less than the operating parameter. For example, if the current that flows through (and/or is measured by) the primary winding 144 through the power conductors 130 is 0.03 A, then the representation of the current generated by the secondary winding 146 is 0.003 A. The differential current transformer 142 measures the difference between the current flowing out of each of the power conductors 131, 132, 134, and the corresponding current returning through the neutral line 136. For example, when the difference is non-zero, a leakage of current exists and may cause a ground fault situation.

In certain embodiments, the ground fault detection device 151 determines that the representation of the operating parameter exceeds a ground fault threshold. The exemplary ground fault detection device 151 sends, based on determining that the representation of the operating parameter exceeds the ground fault threshold, a notification that a ground fault condition exists. The ground fault detection device 151 can send the notification to the status indicator 118 (which is electrically coupled to the ground fault detection device 151) using, for example, the instrumentation line 120. These functions of the ground fault detection device 151 are substantially similar to the functions performed by the protection device 111 described above with respect to FIG. 1A. The ground fault detection device 151 may include hardware and/or software and may be a computing device, as described below with respect to FIG. 4.

Figure 2A:
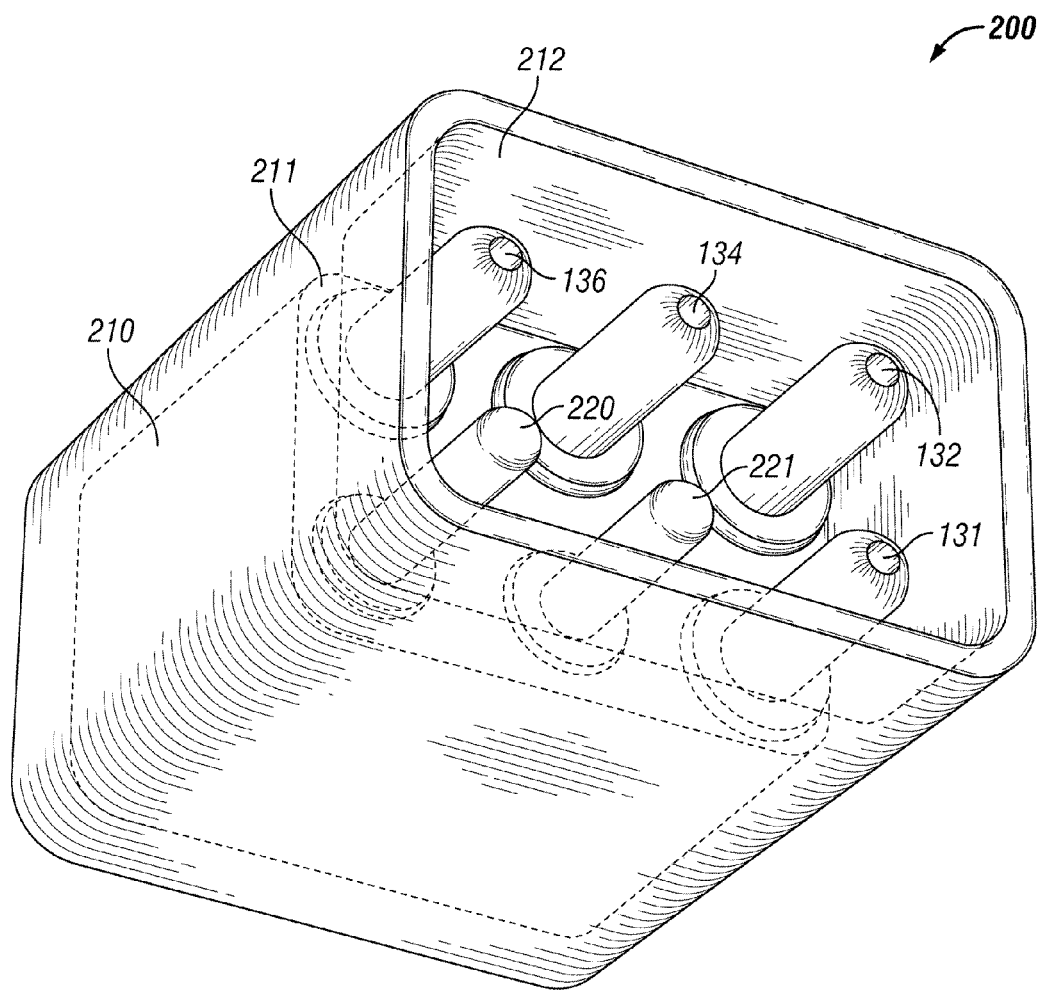
FIGS. 2A-C show various views of a plug housing in accordance with one or more exemplary embodiments.
Figure 2B:
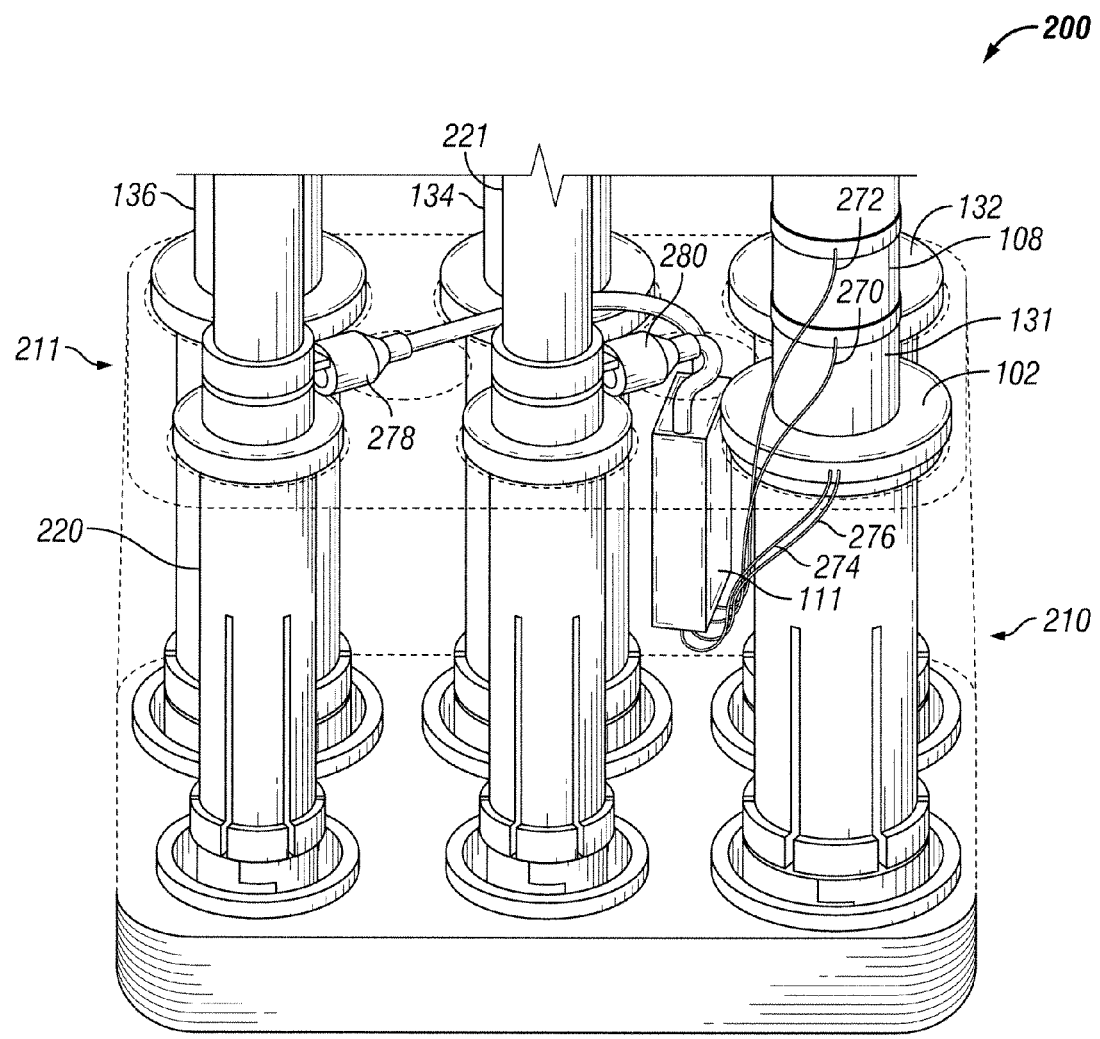
Figure 2C:
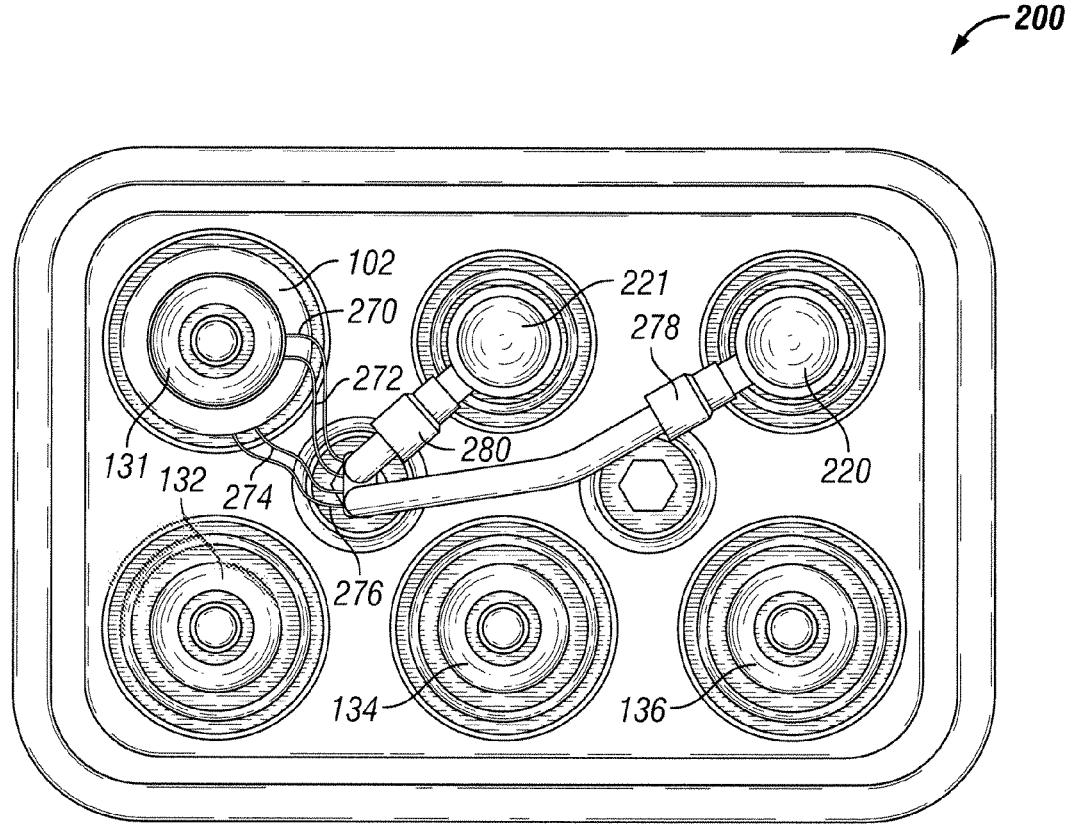

FIGS. 2A-C show various views of a plug housing 200 in accordance with one or more exemplary embodiments. Referring now to FIGS. 1A-B and 2A-C, FIG. 2A shows a transparent perspective view of the exemplary plug housing 200. The plug housing 200 has a number of male pins (e.g., power conductor A 131, neutral line 136, instrumentation line F 221) extending upward in the top housing 212. The male pins couple to the female apertures in the connector of the grounded aircraft. In this example, there are a total of six pins. Four of the pins are larger (e.g., wider) and correspond to the power conductors (power conductor A 131, power conductor B 132, power conductor C 134, and the neutral line 136). The two smaller pins correspond to the instrumentation lines (instrumentation line E 220, instrumentation line F 221).

The plug housing 200 also has an interior cavity. Specifically, the exemplary plug housing 200 has a lower cavity 210 and an intermediate cavity 211. The lower cavity 210 and/or the intermediate cavity 211 of the plug housing 200 house one or more components of the system described above with respect to FIG. 1A and/or FIG. 1B. Such components include, but are not limited to, the sensing device 112, 114 or 142, the protection device 111, the shunt 108, the ground fault detection device 151, and the overtemperature device.

FIG. 2B shows a transparent side view of the lower cavity 210 and the intermediate cavity 211 of the plug housing 200 according to certain exemplary embodiments. In certain exemplary embodiments, the protection device 111 is positioned in the lower cavity 210. One or more other components (e.g., the ground fault detection device 151) are also positioned inside the lower cavity 210. Wire A 270 and wire B 272 are connected at one end to the protection device 111 and at the other end to opposing ends of the shunt 108, which is integrated inline with power conductor 131. Wire C 274 and wire D 276 are used to couple the sensing device 102 (in this case, a current transformer) to the protection device 111. Wire E 278 and wire F 280 are coupled to instrumentation line E 220 and instrumentation line F 221, respectively, to provide power to the protection device 111 to allow the protection device 111 and its components to operate.

Wire A 270, wire B 272, wire C 274, wire D 276, wire E 278, and wire F 280 traverse an aperture at the top of the lower cavity 210 into the intermediate cavity 211. As shown in FIGS. 2B and 2C, wire A 270 and wire B 272 connect to the shunt, wire C 274 and wire D 276 connect to the sensing device 102, wire E 278 connects to instrumentation line E 220, and wire F 280 connects to instrumentation line F 221 in the intermediate cavity 211. The sensing device 102 and the shunt 108 are connected in series to power conductor A 131. In one or more alternative embodiments, wire E 278 and/or wire F 280 can be connected to one or more power conductors (e.g., power conductor A 131, power conductor B 132, power conductor C 134) to provide power to the protection device 111.

Figure 2D:
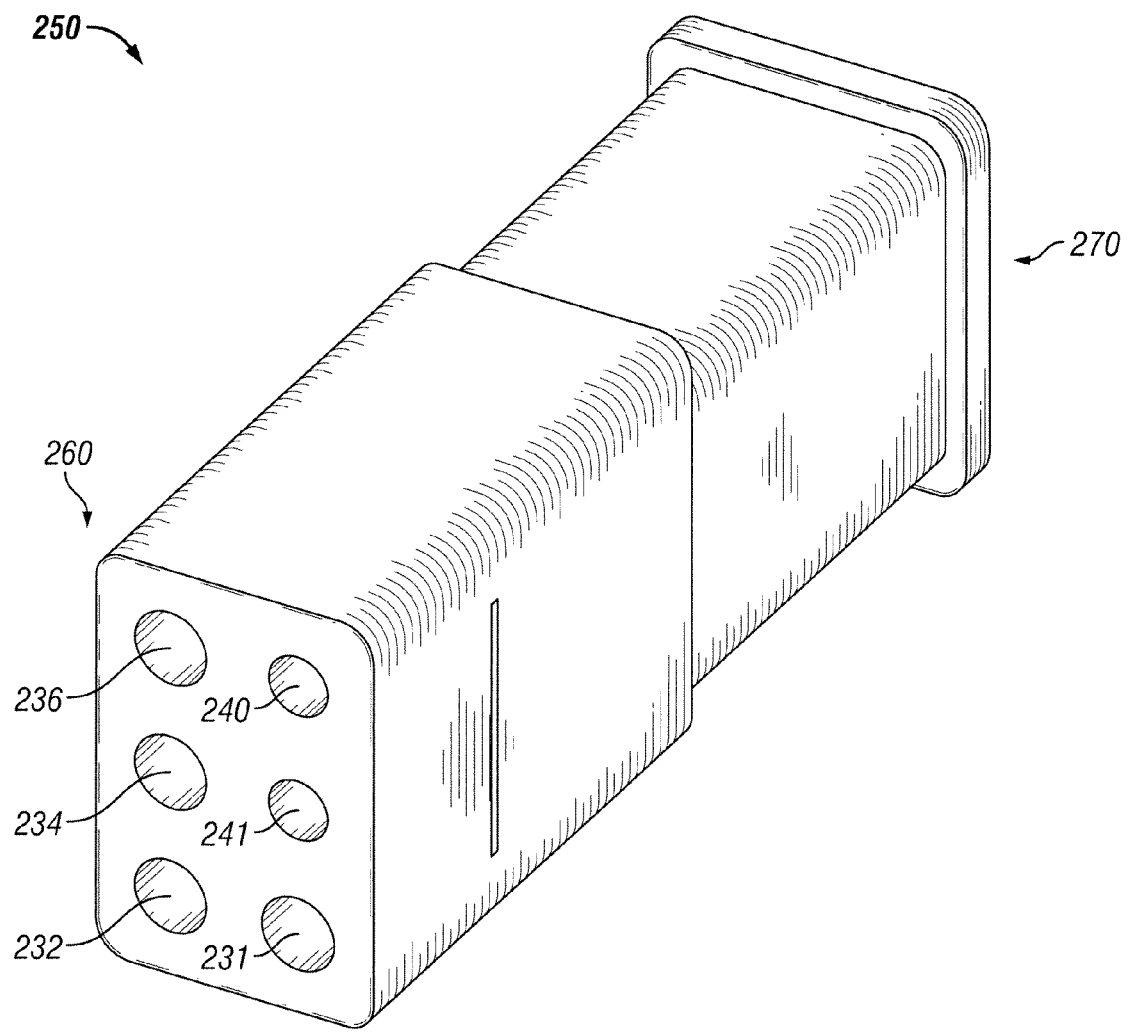
FIG. 2D shows a removable adapter of a plug housing in accordance with one or more exemplary embodiments.

FIG. 2D shows a removable adapter 250 of the plug housing 200 in accordance with one or more exemplary embodiments. The removable adapter 250 includes a first end 260 and a second end 270. The exemplary first end 260 includes a number of apertures that receive and couple to the one or more male pins of the plug housing 200, as described above with respect to FIGS. 2A-C. Each of the apertures of the first end 260 may have dimensions (e.g., depth, width, shape) that ensure solid contact for electrical conduction with the corresponding male pins of the plug housing 200. For example, aperture A 231, aperture B 232, aperture C 234, and aperture N 236 receive and maintain solid electrical contact with the male pins corresponding to power conductor A 131, power conductor B 132, power conductor C 134, and the neutral line 136, respectively, of the plug housing 200. Likewise, exemplary aperture E 240 and aperture F 241 receive and maintain solid electrical contact with the male pins corresponding to instrumentation line E 220, instrumentation line F 221, respectively, of the plug housing 200.

The second end 270 of the plug housing 250 includes a number of male pins to couple to the connector of the grounded aircraft. In certain exemplary embodiments, the configuration of the male pins of the second end 270 of the removable adapter 250 is the same as the configuration of male pins within the top housing 212 of the plug housing 200, as described above with respect to FIGS. 2A-C. Alternatively, the configuration of the male pins of the second end 270 of the removable adapter 250 are different than the configuration of male pins within the top housing 212 of the plug housing 200.

In certain exemplary embodiments, the removable adapter 250 contains one or more components of the system described herein. For example, the sensing device, the protection device, the shunt 108, the ground fault detection device 151, and/or the overtemperature device may be positioned inside the removable adapter 250. The removable adapter 250 may provide electrical continuity between the apertures in the first end 260 and the male pins in the second end 270. The removable adapter 250 may be made of one or more of a number of materials including, but are not limited to, rubber, plastic, aluminum, and copper.

Figure 3:
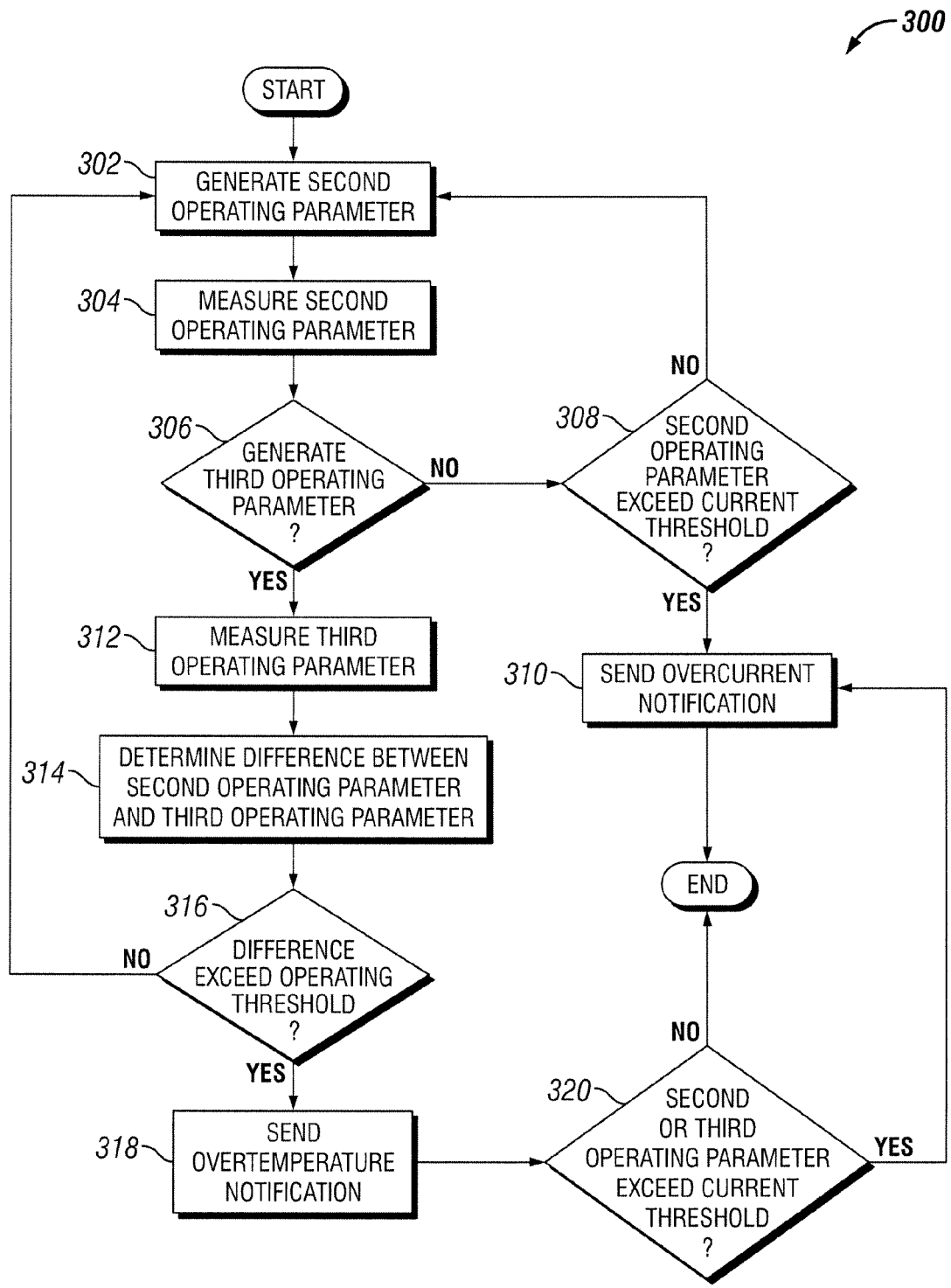
FIG. 3 is a flowchart presenting a method for detecting an overcurrent condition in an electrical connector in accordance with one or more exemplary embodiments.

FIG. 3 shows a flowchart of a method 300 for detecting an overcurrent condition in an electrical connector providing power to a grounded aircraft in accordance with one or more exemplary embodiments. While the various steps in the flowcharts presented herein are described sequentially, one of ordinary skill will appreciate that some or all of the steps may be executed in different orders, may be combined or omitted, and some or all of the steps may be executed in parallel. Further, in one or more of the exemplary embodiments, one or more of the steps described below may be omitted, repeated, and/or performed in a different order. In addition, a person of ordinary skill in the art will appreciate that additional steps may be included in performing the methods described herein. Accordingly, the specific arrangement of steps shown should not be construed as limiting the scope.

Further, in one or more exemplary embodiments, a particular computing device, as described, for example, in FIG. 5 below, is used to perform one or more of the method steps described herein. Also, one or more of the method steps described herein may be performed inside a plug housing of the electrical connector. In one or more exemplary embodiments, at least a portion of the plug housing is detachable from the electrical connector.

Referring now to FIGS. 1A and 2A-3, the exemplary method 300 being as the START step and continues to Step 302 where a second operating parameter is generated. In one or more exemplary embodiments, the second operating parameter is based on a first operating parameter of each of a number of power conductors. The power conductors may include a first power phase (power conductor A 131), a second power phase (power conductor B 132), and a third power phase (power conductor C 134). The second operating parameter may be measured using one or more of a number of sensing devices 102. Alternatively, the second operating parameter may be measured using a shunt 108.

The sensing device 102 and shunt 108 typically generate the second operating parameter based on the first operating parameter. For example, the sensing device 102 may generate a current of 0.3 A as a second operating parameter when 300 A of current, representing the first operating parameter, flows through a power conductor 130. As another example, a shunt 108 may generate a voltage of 3.6 V as a second operating parameter when 300 A of current, representing the first operating parameter, flows through a power conductor 130. The second operating parameter may be a proportionately smaller quantity than the first operating parameter based on a ratio (as with a transformer). In one or more exemplary embodiments, the second operating parameter is independent of a temperature of the corresponding power conductor (e.g., power conductor A 131, power conductor B 132, power conductor C 134).

In Step 304, the second operating parameter is measured. In certain exemplary embodiments, the second operating parameter is measured using a signal conditioner 112, 114 of the protection device 111. In one or more exemplary embodiments, the second operating parameter is measured for each of the power conductors (e.g., power conductor A 131, power conductor B 132, power conductor C 134). The exemplary measurement device is capable of accurately measuring the second operating parameter. The second operating parameter is expressed in terms of a unit of measure (e.g., volts, amperes, ohms, ° F.), which may be the same as or different than the unit of measure of the first operating parameter.

A determination is made as to whether a third operating parameter is generated in Step 306. In one exemplary embodiment, the third operating parameter is generated by and measured at a device different than the device used to measure the second operating parameter, as described above with respect to Step 302. For example, if a sensing device 102 is used to measure the second operating parameter, then the third operating parameter may be measured by a shunt 108. In such a case, the shunt 108 may be coupled to each of the power conductors (e.g., power conductor A 131, power conductor B 132, power conductor C 134). Further, in such a case, the third operating parameter may correspond to (depend upon) a temperature of the shunt 108 and/or the corresponding power conductor (e.g., power conductor A 131, power conductor B 132, power conductor C 134). The third operating parameter may be measured using one or more of a number of sensing devices 102, which may generate the third operating parameter based on the first operating parameter. The shunt 108 (associated with the third operating parameter) and the sensing device 102 (associated with the second operating parameter) may be connected in series for each of the power conductors (e.g., power conductor A 131, power conductor B 132, power conductor C 134). If a third operating parameter is generated, then the YES branch is followed to Step 312. If a third operating parameter is not generated, then the NO branch is followed to Step 308.

In Step 308, a determination is made as to whether the second operating parameter of at least one of the power conductors (e.g., power conductor A 131, power conductor B 132, power conductor C 134) exceeds a current threshold. In certain exemplary embodiments, this determination is may by the logic 116 of the protection device 111. If the unit of measure of the second operating parameter is not measured in terms of amperes (or some other form of current), then a conversion of the second operating parameter is performed. The current threshold may represent an amount of current flowing on one or more of the power conductors (e.g., power conductor A 131, power conductor B 132, power conductor C 134) that causes an overcurrent situation. For example, if 300 A of current (first operating parameter) flowing on the second power phase (power conductor B 132) represents an overcurrent situation, then the current threshold may be 0.03 A. If the second operating parameter of at least one of the power conductors exceeds the current threshold, then the process proceeds to Step 310. If the second operating parameter of at least one of the power conductors is less than the current threshold, then the process reverts to Step 302.

In certain exemplary embodiments, if a third operating parameter is not being generated and measured, then the second operating parameter is generated by and measured at a shunt 108. In such a case, the shunt 108 is electrically coupled to each of the power conductors (e.g., power conductor A 131, power conductor B 132, power conductor C 134). Also, in such a case, the second operating parameter corresponds to a temperature of the shunt 108.

In Step 310, an overcurrent notification is sent from the logic 116 of the protection device 111 to the status indicator 118. In certain exemplary embodiments, the overcurrent notification is sent using hard wires and/or wireless technology. The overcurrent notification may be sent by the logic 116 of the protection device 111 according to one or more protocols (e.g., procedural, software code). The overcurrent notification may be sent, in addition or in the alternative, directly or indirectly, to a user. The exemplary process then proceeds to the END step.

Returning to Step 312, a third operating parameter is measured. In one exemplary embodiment, the third operating parameter is measured using a measurement device (e.g., a temperature measuring device), which is capable of accurately measuring the third operating parameter. The third operating parameter may be expressed in terms of a unit of measure (e.g., volts, amperes, ohms, ° F.), which may be the same as or different than the unit of measure of the first operating parameter and/or the second operating parameter. The measurement device may be the same as or different than the signal conditioner 112, 114 of the protection device 111 described above with respect to Step 304.

A difference between the second operating parameter and the third operating parameter is determined in Step 314. In certain exemplary embodiments, the difference is determined by the logic 116 of the protection device 111. Specifically, a difference between a value representing the second operating parameter and a value representing the third operating parameter is determined. In exemplary embodiments, if the unit of measure for the second operating parameter is different than the unit of measure for the third operating parameter, then the unit of measure of one is converted to the unit of measure of the other. A difference may be determined for one or more of the power conductors (e.g., power conductor A 131, power conductor B 132, power conductor C 134) and may be based on (caused by) the temperature of the shunt 108.

In Step 316, a determination is made by the logic 116 of the protection device 111 as to whether the difference exceeds an operating threshold. The exemplary operating threshold represents an operating parameter (e.g., current, voltage) of one or more of the power conductors (e.g., power conductor A 131, power conductor B 132, power conductor C 134) that causes an overtemperature situation. For example, the second operating parameter may be represented by 0.025 A, and the third operating parameter may be represented by 0.03 A. Because the difference (0.005 A) is caused by temperature affecting the shunt 108, an operating threshold (e.g., 0.003 A) may correspond to a temperature at which an overtemperature situation occurs. If the difference exceeds the operating threshold, then the YES branch is followed to Step 318. Otherwise, the NO branch is followed back to Step 302.

In Step 318, a temperature notification is sent from the logic 116 of the protection device 111 to the status indicator 118. In one exemplary embodiment, the temperature notification is sent using hard wires and/or wireless technology. The temperature notification may be sent according to one or more protocols (e.g., procedural, software code) and may be sent using the same and/or different technology and/or protocols in comparison to sending the overcurrent notification. The temperature notification may be sent, in addition or in the alternative, directly or indirectly, to a user.

A determination is made by the logic 116 of the protection device 111 as to whether the second operating parameter or the third operating parameter exceed the current threshold in Step 320. This Step 320 is similar to Step 308 described above. If the second operating parameter and/or the third operating parameter exceed the current threshold, then the YES branch is followed back to Step 310. If neither the second operating parameter nor or the third operating parameter exceed the current threshold, then the NO branch is followed to the END step.

Figure 4:
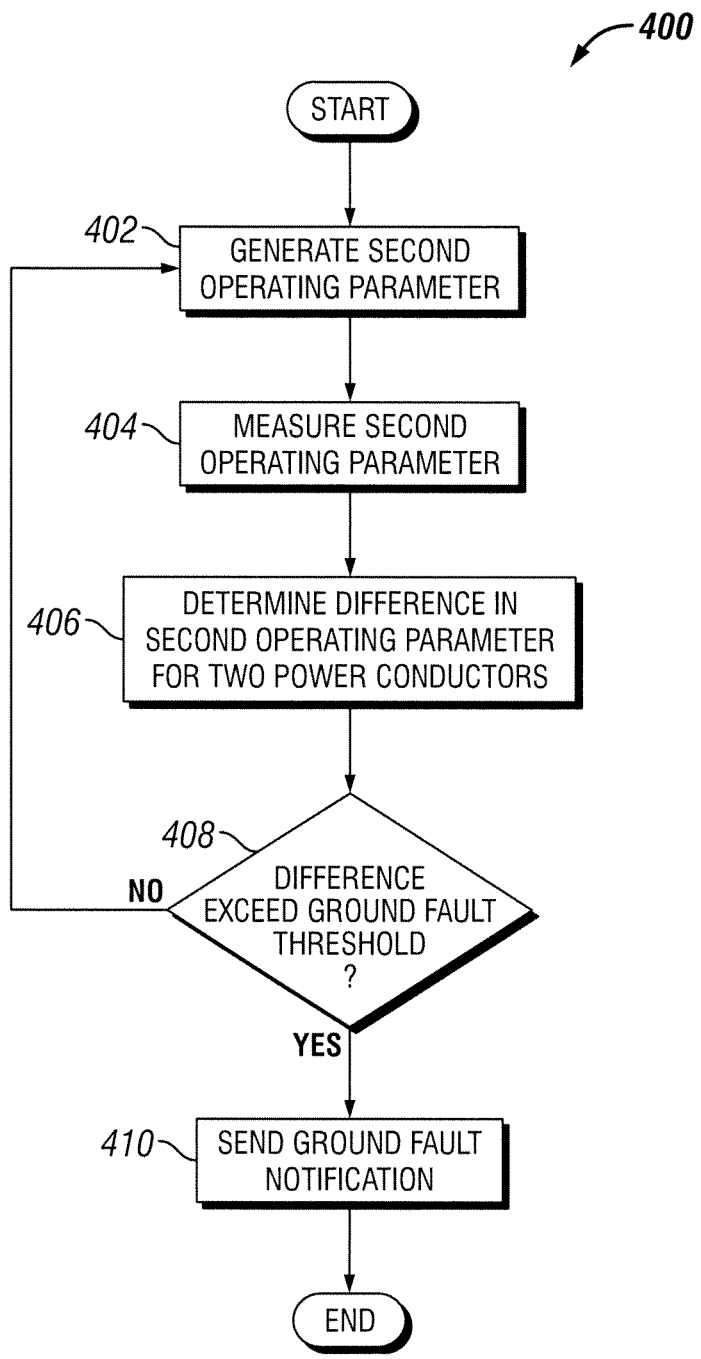
FIG. 4 is a flowchart presenting a method for detecting a ground fault in an electrical connector in accordance with one or more exemplary embodiments.

FIG. 4 shows a flowchart of a method 400 for detecting ground fault in an electrical connector providing power to a grounded aircraft in accordance with one or more exemplary embodiments. While the various steps in the flowcharts presented herein are described sequentially, one of ordinary skill will appreciate that some or all of the steps may be executed in different orders, may be combined or omitted, and some or all of the steps may be executed in parallel. Further, in one or more of the exemplary embodiments, one or more of the steps described below may be omitted, repeated, and/or performed in a different order. In addition, a person of ordinary skill in the art will appreciate that additional steps may be included in performing the methods described herein. Accordingly, the specific arrangement of steps shown should not be construed as limiting the scope.

Further, in one or more exemplary embodiments, a particular computing device, as described, for example, in FIG. 5 below, is used to perform one or more of the method steps described herein. Also, one or more of the method steps described herein may be performed inside a plug housing of the electrical connector. In one or more exemplary embodiments, at least a portion of the plug housing is detachable from the electrical connector.

Referring now to FIGS. 1B-2D and 4, the exemplary method 400 begins at the START step and proceeds to Step 402, where a second operating parameter is generated, for example, by the ground fault detection device 151. In one exemplary embodiment, the second operating parameter is based on a first operating parameter of each of a number of power conductors. The power conductors may include a first power phase (i.e., power conductor A 131), a second power phase (i.e., power conductor B 132), a third power phase (i.e., power conductor C 134), and a neutral line (i.e., neutral line 136). The second operating parameter may be generated using one or more of a number of sensing devices 142. The sensing device may generate the second operating parameter based on the first operating parameter. The second operating parameter may be a proportionately smaller quantity than the first operating parameter based on a ratio.

In Step 404, the second operating parameter is measured. In one or more exemplary embodiments, the second operating parameter is measured for each of the power conductors (e.g., power conductor A 131, power conductor B 132, power conductor C 134, neutral line 136). The second operating parameter may be measured using the signal conditioner 148. The signal conditioner 148 of the ground fault detection device 151 may be capable of accurately measuring the second operating parameter. The second operating parameter may be expressed in terms of a unit of measure (e.g., volts, amperes, ohms), which may be the same as or different than the unit of measure of the first operating parameter.

In Step 406, a difference in the second operating parameter for two or more power conductors (e.g., power conductor A 131, power conductor B 132, power conductor C 134, neutral line 136) is determined. Specifically, a difference between a value representing the second operating parameter in one power conductor and a value representing the third operating parameter in another power conductor is determined. The difference may be determined by the logic 116 of the ground fault detection device 151.

In Step 408, a determination is made as to whether the difference exceeds a ground fault threshold. The ground fault threshold may represent an operating parameter (e.g., current, voltage) of two or more of the power conductors (e.g., power conductor A 131, power conductor B 132, power conductor C 134, neutral line 136) that causes a ground fault situation. For example, the second operating parameter for one power conductor may be represented by 0.025 A, and the second operating parameter for a different power conductor may be represented by 0.03 A. The resulting difference (0.005 A) may exceed a ground fault threshold (e.g., 0.003 A), which triggers a ground fault situation. The determination as to whether the difference exceeds the ground fault threshold may be made by the logic 116 of the ground fault detection device 151. If the difference exceeds the ground fault threshold, then the process proceeds to Step 410. If the difference does not exceed the operating threshold, then the process reverts to Step 402.

In Step 410, a ground fault notification is sent. In one or more exemplary embodiments, the ground fault notification is sent by the logic 116 of the ground fault detection device 151 using hard wires and/or wireless technology. The ground fault notification may be sent according to one or more protocols (e.g., procedural, software code). The ground fault notification may be sent, directly or indirectly, to a status indicator 118 and/or a user. The ground fault notification may be sent using the same and/or different technology and/or protocols in comparison to sending the overcurrent notification and/or temperature notification. After Step 410 is completed, the process proceeds to the END step.

Figure 5:
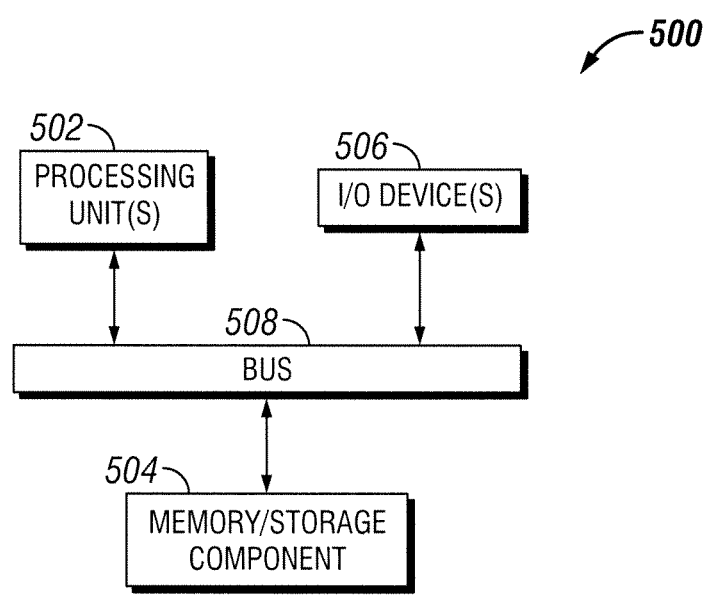
FIG. 5 shows a computer system for implementing one or more techniques in accordance with one or more exemplary embodiments.

FIG. 5 illustrates one example of a computing device 500 used to implement one or more of the various techniques described herein, and which may be representative, in whole or in part, of the elements described herein. Computing device 500 is only one example of a computing device and is not intended to suggest any limitation as to scope of use or functionality of the computing device and/or its possible architectures. Neither should computing device 500 be interpreted as having any dependency or requirement relating to any one or combination of components illustrated in the example computing device 500.

Computing device 500 includes one or more processors or processing units 502, one or more memory/storage components 504, one or more input/output (I/O) devices 506, and a bus 508 that allows the various components and devices to communicate with one another. Bus 508 represents one or more of any of several types of bus structures, including a memory bus or memory controller, a peripheral bus, an accelerated graphics port, and a processor or local bus using any of a variety of bus architectures. Bus 508 can include wired and/or wireless buses.

Memory/storage component 504 represents one or more computer storage media. Memory/storage component 504 may include volatile media (such as random access memory (RAM)) and/or nonvolatile media (such as read only memory (ROM), flash memory, optical disks, magnetic disks, and so forth). Memory/storage component 504 can include fixed media (e.g., RAM, ROM, a fixed hard drive, etc.) as well as removable media (e.g., a Flash memory drive, a removable hard drive, an optical disk, and so forth).

One or more I/O devices 506 allow a customer, utility, or other user to enter commands and information to computing device 500, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media may be any available non-transitory medium or non-transitory media that can be accessed by a computing device. By way of example, and not limitation, computer readable media may comprise "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The computer device 500 may be connected to a network (not shown) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system 500 includes at least the minimal processing, input, and/or output means necessary to practice one or more embodiments.

Further, those skilled in the art will appreciate that one or more elements of the aforementioned computer device 500 may be located at a remote location and connected to the other elements over a network. Further, one or more embodiments may be implemented on a distributed system having a plurality of nodes, where each portion of the implementation (e.g., protection device 111, ground fault detection device 151) may be located on a different node within the distributed system. In one or more embodiments, the node corresponds to a computer system. Alternatively, the node may correspond to a processor with associated physical memory. The node may alternatively correspond to a processor with shared memory and/or resources.

The following description (in conjunction with FIGS. 1 through 5) describes a number of examples in accordance with one or more exemplary embodiments. The examples are for explanatory purposes only and are not intended to limit the scope. Terminology used in FIGS. 1 through 5 may be used in these examples without further reference to FIGS. 1 through 5

Example 1

Consider the following example, shown in FIGS. 6A through 6D, which describes a system 600 for protecting an electrical connector providing power to a grounded aircraft from an overcurrent situation in accordance with certain exemplary embodiments. In this example, the system is configured as shown in FIG. 1A, except that the shunt 108 is omitted.

Referring to FIG. 6A, initially, a power source 602 that provides the power to the grounded aircraft through the electrical connector sends 300 A through each of the three power conductors. In this example, only the monitoring of power conductor A is shown. A sensing device (in this case, a CT 604, a current transformer) is coupled to power conductor A. In this example, the CT has a ratio of 1000:1, so that the current flowing through the primary winding of the CT (the first operating parameter) generates a current flowing through the secondary winding of the CT (the second operating parameter, also known as a representation of the operating parameter) that is proportionately smaller by 1,000 times. The CT 604 measures the 300 A current (the first operating parameter) flowing through power conductor A and generates a current (the second operating parameter) off the secondary winding of the CT 604. The current generated by the secondary winding of the CT 604 is 0.3 A.

Continuing with FIG. 6A, the protection device 606 receives the current generated by the secondary winding of the CT 604 and measures the current as 0.3 A. The protection device 606 then compares the current generated by the secondary winding of the CT 604 with a current threshold. In this example, the protection device 606 maintains two current thresholds. The lower current threshold is 0.31 A and only triggers a notification. The higher current threshold is 0.35 A and trips the circuit as well as triggers a notification. Because the current generated by the secondary winding of the CT 604 is less than either current threshold, the protection device 606 does not generate an overcurrent notification. Consequently, the status indicator 608 receives no notification from the protection device 606. In turn, the status indicator 608 communicates to the user 610 that normal operation is occurring. The CT 604 and the protection device 606 are physically housed inside of a removable adapter 612.

In FIG. 6B, the current provided by the power source 602 to power conductor A increases to 310 A. The CT 604 measures the 310 A current (the first operating parameter) flowing through power conductor A and generates a current (the second operating parameter) off the secondary winding of the CT 604. Based on the 1000:1 ratio of the CT, the current generated by the secondary winding of the CT 604 is 0.31 A.

Continuing with FIG. 6B, the protection device 606 receives the current generated by the secondary winding of the CT 604 and measures the current as 0.31 A. The protection device 606 then compares the current generated by the secondary winding of the CT 604 with the current thresholds. Because the current generated by the secondary winding of the CT 604 (0.31 A) equals the first (lower) current threshold (0.31 A), the protection device 606 generates an overcurrent notification and sends the overcurrent notification to the status indicator 608. Consequently, the status indicator 608 receives the overcurrent notification from the protection device 606 and communicates (e.g., warning light, siren, flashing indicator on a control panel) to the user 610 that an overcurrent situation exists. However, because the current generated by the secondary winding of the CT 604 (0.31 A) is less than the second (higher) current threshold (0.35 A), the protection device 606 does not trip the circuit.

In FIG. 6C, the current provided by the power source 602 to power conductor A again increases to 350 A. The CT 604 measures the 350 A current (the first operating parameter) flowing through power conductor A and generates a current (the second operating parameter) off the secondary winding of the CT 604. Based on the 1000:1 ratio of the CT, the current generated by the secondary winding of the CT 604 is 0.35 A.

Continuing with FIG. 6C, the protection device 606 receives the current generated by the secondary winding of the CT 604 and measures the current as 0.35 A. The protection device 606 then compares the current generated by the secondary winding of the CT 604 with the current thresholds. Because the current generated by the secondary winding of the CT 604 (0.35 A) is greater than the lower current threshold (0.31 A), the protection device 606 continues to generate the overcurrent notification and to send the overcurrent notification to the status indicator 608. Consequently, the status indicator 608 continues to receive the overcurrent notification from the protection device 606 and to communicate to the user 610 that the overcurrent situation exists. In addition, because the current generated by the secondary winding of the CT 604 (0.35 A) equals the second (higher) current threshold (0.35 A), the protection device 606 sends a signal (a trip command) to the power source 602 to shut down power to the circuit.

In FIG. 6D, the user 610 replaces removable adapter A 612 with removable adapter B 614. Removable adapter B 614 has its own set of CTs (e.g., CT 624) and protection device 626. The user replaces removable adapter A 612 with removable adapter B 614 because it appears that there is cracking on the insulation and there is evidence of arcing on the male pins in removable adapter A 612, which may cause an overcurrent situation and/or a short circuit (or ground fault) situation. When removable adapter B 614 is in place, operating conditions return to normal, as they were in FIG. 6A above.

Example 2

Figure 7A:
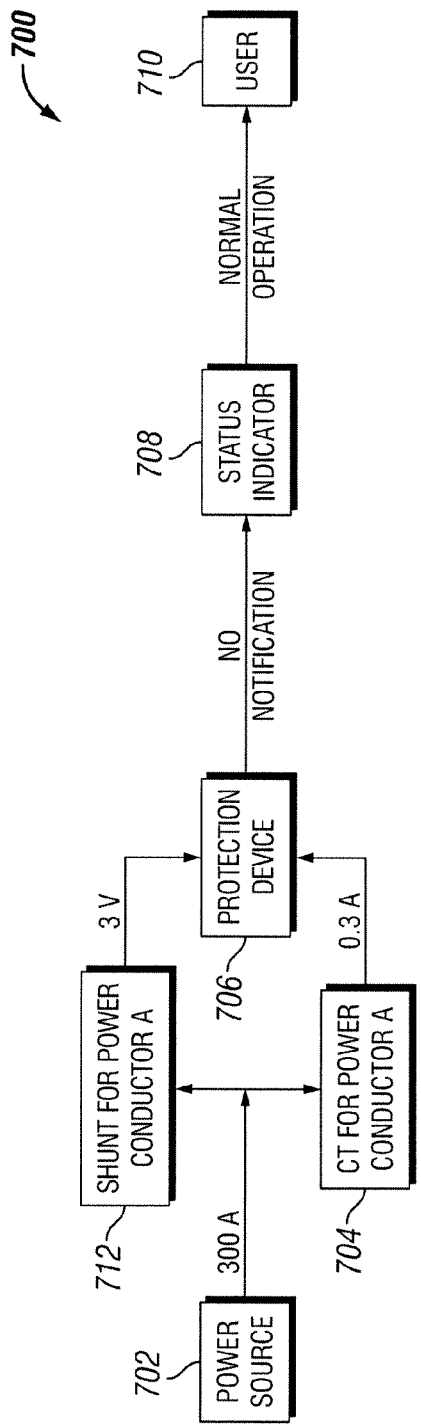
FIGS. 7A-7C present various examples of a system for protecting an electrical connector providing power to a grounded aircraft from an overtemperature situation in accordance with one or more exemplary embodiments.
Figure 7B:
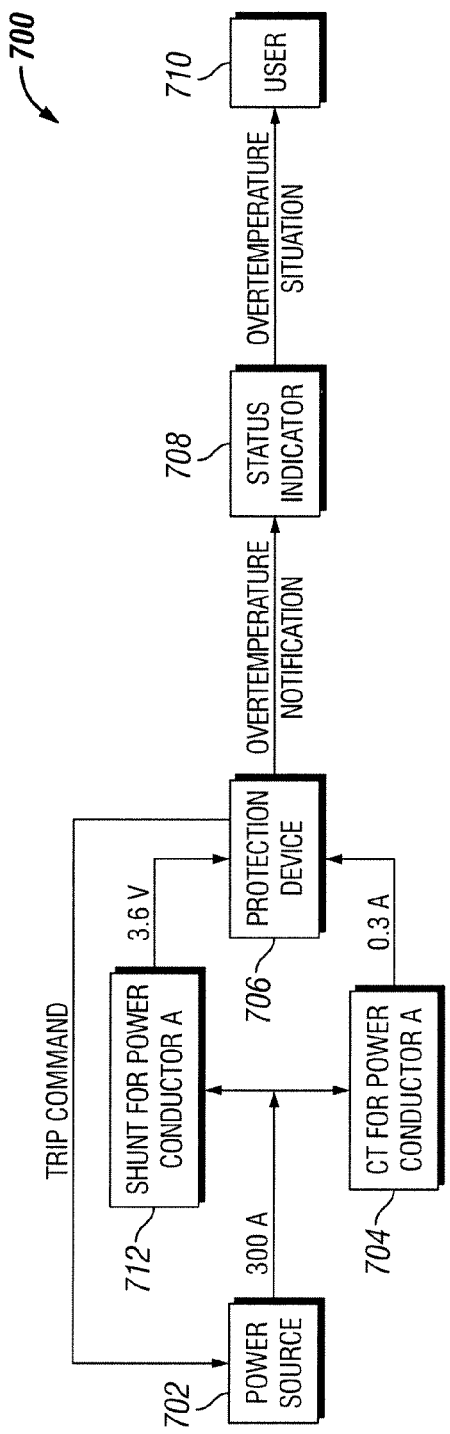
Figure 7C:
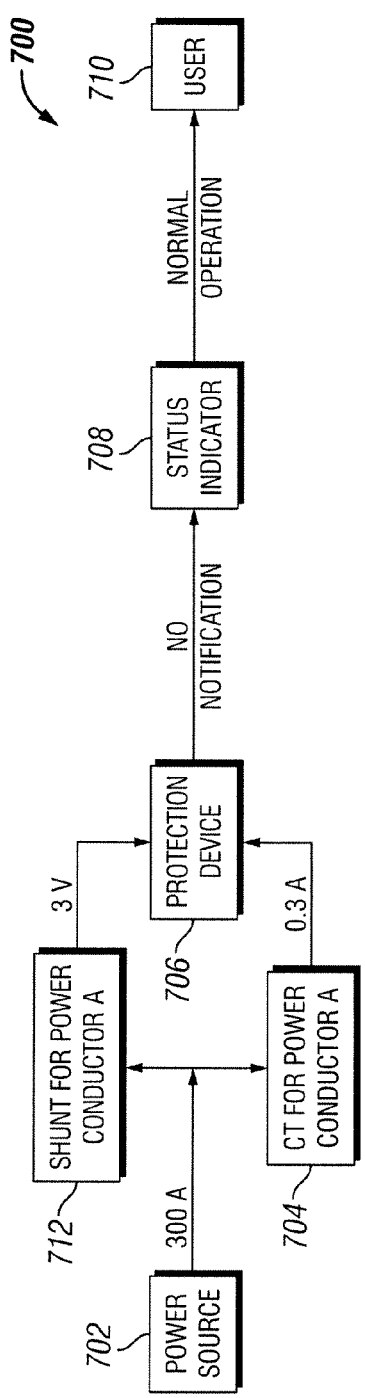

Consider the following example, shown in FIGS. 7A through 7C, which describes a system 700 for protecting an electrical connector providing power to a grounded aircraft from an overtemperature situation in accordance with one or more embodiments described above. In this example, the system is configured as shown in FIG. 1A using a removable adapter as shown in FIG. 2D.

Referring to FIG. 7A, initially, a power source 702 that provides the power to the grounded aircraft through the electrical connector and the removable adapter sends 300 A through each of the three power conductors. In this example, only the monitoring of power conductor A is shown. Two sensing devices, connected in series, are coupled to power conductor A. Specifically, a CT 704 and a current shunt 712 are coupled to power conductor A. The CT 704 and/or the current shunt 712 may be located within the electrical connector and/or the removable adapter. In this example, the CT has a ratio of 1000:1. The CT 704 measures the 300 A current (the first operating parameter) flowing through power conductor A and generates a current (the second operating parameter, also known as a representation of the operating parameter) off the secondary winding of the CT 704. The current generated by the secondary winding of the CT 704 is 0.3 A. After the 300 A current continues to flow beyond the CT 704 in power conductor A, the 300 A current flows through the current shunt 712. As a result, the current shunt 712 generates a voltage (the third operating parameter). The voltage generated by the current shunt 712 is 3.0 V Continuing with FIG. 7A, the protection device 706, which may be located within the electrical connector and/or the removable adapter, receives the current generated by the secondary winding of the CT 704 and measures the current as 0.3 A. The protection device 706 also receives the voltage generated by the current shunt 712 and measures the voltage as 3.0 V. The protection device 706 then compares the current generated by the secondary winding of the CT 704 with one or more current thresholds. In this example, the lowest current threshold is 0.31 A. Because the current generated by the secondary winding of the CT 704 is less than the lowest current threshold, the protection device 706 does not generate an overcurrent notification based on the current generated by the CT 704.

The protection device 706 also converts the voltage generated by the current shunt 712 to an equivalent current. For example, assume that the equivalent current, based on the current generated by the secondary winding of the CT 704, of the voltage generated by the current shunt 712 is 0.28 A. Because the equivalent current is also less than the lowest current threshold, the protection device 706 does not generate an overcurrent notification based on the voltage generated by the current shunt 712. Consequently, the status indicator 708 receives no notification from the protection device 706. In turn, the status indicator 708 communicates to the user 710 that normal operation is occurring with respect to a overcurrent situation.

Continuing with FIG. 7A, the protection device 706 also determines a temperature of the current shunt 712 (and, therefore, a temperature of power conductor A). Because the current shunt 706 has known operating characteristics based on the size and material of the current shunt 706 as well as the voltage generated by the current shunt, the protection device 706 may determine the temperature of the current shunt 712 based, in part, on the current generated by the secondary winding of the CT 704. Here, for example, the protection device 706 determines that the temperature of the current shunt 712 is 110° F.

The protection device 706 then compares the implied temperature of the current shunt 712 with a temperature threshold. In this example, the temperature threshold maintained by the protection device 706 is 125° F. When a temperature meets or exceeds the termperature threshold, the protection device 706 trips the circuit and triggers an overtemperature notification. Because the implied temperature of the current shunt 712 is less than the temperature threshold, the protection device 706 does not generate an overtemperature notification. Consequently, the status indicator 708 receives no notification from the protection device 706, and no trip command is sent to the power source 702. In turn, the status indicator 708 communicates to the user 710 that normal operation is occurring.

In FIG. 7B, the current provided by the power source 702 to power conductor A continues to be 300 A. The CT 704 measures the 300 A current flowing through power conductor A and continues to generate a current off the secondary winding of the CT 704. Based on the 1000:1 ratio of the CT, the current generated by the secondary winding of the CT 704 continues to be 0.30 A. Likewise, the current shunt 712 continues to generate a voltage. In this example, however, the voltage generated by the current shunt 712 has increased to 3.6 V.

Continuing with FIG. 7B, the protection device 706 continues to receive the current generated by the secondary winding of the CT 704 and continues to measure the current as 0.3 A. Because the current generated by the secondary winding of the CT 704 is still less than the lowest current threshold, the protection device 706 does not generate an overcurrent notification based on the current generated by the CT 704.

The protection device 706 also receives the voltage generated by the current shunt 712 and measures the increased voltage as 3.6 V. The protection device 706 again converts the voltage generated by the current shunt 712 to an equivalent current. In this example, the equivalent current of the 3.6 V current shunt voltage, using the previous temperature of 110° F., is 0.36 A. Because of the discrepancy between the equivalent current of 0.36 A and the current generated by the secondary winding of the CT 704 of 0.030 A, the protection device 706 uses one or more algorithms to determine that there is a potential overtemperature situation.

Continuing with FIG. 7B, the protection device 706 determines, using the current generated by the secondary winding of the CT 704 of 0.30 A, the temperature of the current shunt 712 (and, therefore, a temperature of power conductor A). In this example, the protection device 706 determines that the temperature of the current shunt 712 is 130° F. Because the implied temperature of the current shunt 712 exceeds the temperature threshold, the protection device 706 generates an overtemperature notification. Consequently, the status indicator 708 receives the overtemperature notification from the protection device 706, and a trip command is sent to the power source 702. In turn, the status indicator 708 communicates to the user 710 that an overtemperature situation exists.

In FIG. 7C, the removable adapter is replaced. As a result, the abnormal operating conditions (e.g., the overtemperature situation) are corrected because the cause of the abnormal operating conditions was within the previous removable adapter. Consequently, the current provided by the power source 702 to power conductor A continues to be 300 A. The CT 704 measures the 300 A current flowing through power conductor A and continues to generate a current off the secondary winding of the CT 704. Based on the 1000:1 ratio of the CT, the current generated by the secondary winding of the CT 704 continues to be 0.30 A. Likewise, the current shunt 712 continues to generate a voltage. As in FIG. 7A, the voltage generated by the current shunt 712 is 3.0 V.

The protection device 706, upon receiving the voltage from the shunt 712 for power conductor A and the current from the secondary winding of the CT 704 for power conductor A, determines that operating conditions are within a normal range. Thus, the protection device 706 does not send a notification to the status indicator 608, which sends a notification to the user 610 that operating conditions are normal.

Example 3

Figure 8A:
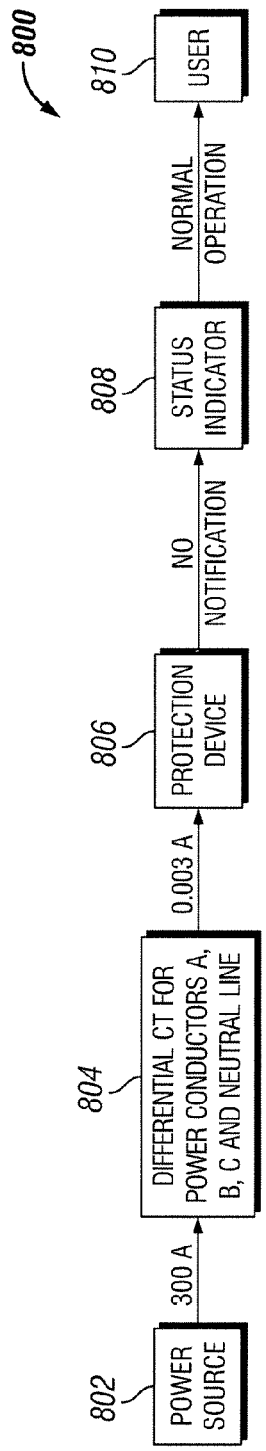
FIGS. 8A and 8B present various examples of a system for protecting an electrical connector providing power to a grounded aircraft from a ground fault situation in accordance with one or more exemplary embodiments.
Figure 8B:
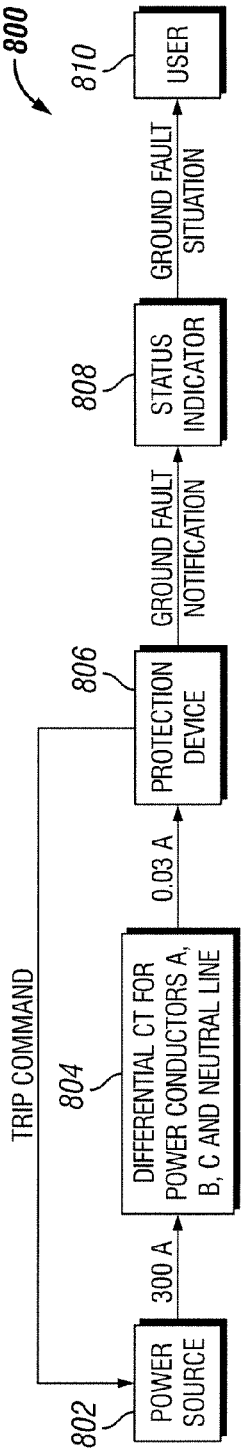

Consider the following example, shown in FIGS. 8A and 8B, which describes a system 800 for protecting an electrical connector providing power to a grounded aircraft from ground fault situation in accordance with one or more embodiments described above. In this example, the system is configured as shown in FIG. 1B.

Referring to FIG. 8A, initially, a power source 802 that provides the power to the grounded aircraft through the electrical connector sends 300 A through each of the three power conductors. In this example, only the monitoring of power conductor A and the neutral line is shown. A sensing device (in this case, a differential CT 804) is coupled to all power conductors (including power conductor A and the neutral line). In this example, the differential CT 804 has a ratio of 10:1, so that a differential current flowing through the primary winding of the differential CT (the first operating parameter) generates a current flowing through the secondary winding of the differential CT (the second operating parameter, also known as a representation of the operating parameter) that is proportionately smaller by 10 times. The differential CT 704 measures a 0.03 A differential current (the first operating parameter) between the current flowing through power conductor A and the current flowing through the neutral line. As a result, the differential CT 804 generates a current (the second operating parameter) off the secondary winding of the differential CT 804. The current generated by the secondary winding of the differential CT 804 is 0.003 A.

Continuing with FIG. 8A, the protection device 806 receives the current generated by the secondary winding of the differential CT 804 and measures the differential current as 0.003 A. The protection device 806 then compares the differential current generated by the secondary winding of the differential CT 804 with a differential current threshold. In this example, the protection device 806 maintains a differential current threshold of 0.01 A, which trips the circuit and triggers a ground fault notification. Because the current generated by the secondary winding of the differential CT 804 is less than the differential current threshold, the protection device 806 does not generate a ground fault notification. Consequently, the status indicator 808 receives no notification from the protection device 806. In turn, the status indicator 808 communicates to the user 810 that normal operation is occurring.

In FIG. 8B, the current provided by the power source 802 to power conductor A remains at 300 A. The differential CT 804 now measures a 0.3 A differential current between the current flowing through power conductor A and the current flowing through the neutral line. As a result, the differential CT 804 generates a current off the secondary winding of the differential CT 804. The current generated by the secondary winding of the differential CT 804 is 0.03 A.

Continuing with FIG. 8B, the protection device 806 receives the differential current generated by the secondary winding of the differential CT 804 and measures the differential current as 0.03 A. The protection device 806 then compares the differential current generated by the secondary winding of the differential CT 804 with the differential current threshold. Because the differential current generated by the secondary winding of the differential CT 804 (0.03 A) is greater than the differential current threshold (0.01 A), the protection device 806 generates a ground fault notification and sends the ground fault notification to the status indicator 808. Consequently, the status indicator 808 receives the ground fault notification from the protection device 806 and communicates to the user 810 that a ground fault situation exists. In addition, the protection device 806 sends a signal (a trip command) to the power source 802 to shut down power to the circuit.

The exemplary embodiments discussed herein provide for safe operating conditions when electric power is fed to a grounded aircraft using an electrical connector. Specifically, the exemplary embodiments automatically detect an overcurrent situation, an overtemperature situation, and/or a ground fault situation that may occur when the electrical connector is plugged into a grounded aircraft. When one or more of an overcurrent situation, an overtemperature situation, and/or a ground fault situation arise, a user may be notified in one of a number of ways using exemplary embodiments. Further, when one or more of an overcurrent situation, an overtemperature situation, and/or a ground fault situation arise, active measures (e.g., tripping the circuit to cut off power) may be taken using exemplary embodiments to prevent further damage and/or injury. Further, the exemplary embodiments described herein provide for detection of an overtemperature situation without the use of a temperature measuring device (e.g., thermocouple).

In addition, exemplary embodiments allow for use of a removable adapter. The removable adapter may allow a user to replace male connecting pins, for example when such male connecting pins become loose, without having to replace the entire cable and/or repair the plug housing. One or more of the components of the detection system described herein may be located in the removable adapter.

Using exemplary embodiments described herein, damage to various equipment associated with the electrical connector and/or the grounded aircraft may be avoided or minimized. For example, if a ground fault at the electrical connector, caused by poor contact between the male pins of the electrical connector and the female terminals for the connector of the grounded aircraft, is detected using certain exemplary embodiments, a fire and/or explosion may be avoided. In such a case, the electrical connector and/or over approximately 100 feet of cable coupled to the electrical connector may be used in subsequent operations.

Although the invention is described with reference to exemplary embodiments, it should be appreciated by those skilled in the art that various modifications are well within the scope and spirit of this disclosure. Those skilled in the art will appreciate that the present invention is not limited to any specifically discussed application and that the embodiments described herein are illustrative and not restrictive. From the description of the exemplary embodiments, equivalents of the elements shown therein will suggest themselves to those skilled in the art, and ways of constructing other embodiments of the present invention will suggest themselves to practitioners of the art. Therefore, the scope of the present invention is not limited herein.

What is claimed is:

1. A protection system for an electrical connector providing power to a grounded aircraft, the system comprising:
   a plug housing comprising an interior cavity;
   a sensing device disposed within the interior cavity and electrically coupled to each of a plurality of power conductors,
      wherein the plurality of power conductors comprises a first power phase, and
      wherein the sensing device generates, based on a first operating parameter of at least one of the plurality of power conductors, a second operating parameter that is smaller than the first operating parameter; and
   a protection device disposed within the interior cavity and comprising:
      a first signal conditioner measuring, for at least one of the plurality of power conductors, the second operating parameter generated by the sensing device; and
      logic determining whether the second operating parameter of at least one of the plurality of power conductors exceeds a current threshold.

2. The system of claim 1, wherein the logic also transmits, based on determining that the second operating parameter exceeds the current threshold, an overcurrent notification to a status indicator.

3. The system of claim 1, further comprising a shunt disposed within the interior cavity and electrically coupled to each of the plurality of power conductors,
   wherein the shunt and the sensing device are electrically coupled in series for each of the plurality of power conductors, and
   wherein the protection device further comprises a second measurement device disposed within the interior cavity and measuring, for at least one of the plurality of power conductors, a third operating parameter generated by the shunt, and wherein the logic of the protection device determines if the third operating parameter of at least one of the plurality of power conductors exceeds the current threshold and sends, based on determining that the third operating parameter exceeds the current threshold, the overcurrent notification to the status indicator.

4. The system of claim 3, wherein the logic of the protection device further:

determines, for at least one of the plurality of power conductors, a difference between the second operating parameter and the third operating parameter;

determines that the difference exceeds an operating threshold; and transmits, based on determining that the difference exceeds the operating threshold, an overtemperature notification to the status indicator, wherein the difference is caused by a temperature of the shunt.

5. The system of claim 4, wherein the sensing device is further electrically coupled to at least one instrumentation line.

6. The system of claim 5, wherein the plug housing further comprises a removable adapter comprising:

a first end comprising a plurality of apertures, each aperture removably coupled to at least one of a first plurality of pins disposed within the plug housing; and a second end comprising a second plurality of pins configured to couple to a connector of the grounded aircraft;

wherein the sensing device, the protection device, and the shunt are disposed within the removable adapter.

7. The system of claim 6, wherein the first plurality of pins further comprises a instrumentation line, and wherein the protection device transmits the overcurrent notification through the instrumentation line.

8. The system of claim 1, wherein the sensing device is a current transformer, and wherein the second operating parameter is a current.

9. The system of claim 1, wherein the sensing device is a potential transformer, and wherein the second operating parameter is a voltage.

10. The system of claim 1, wherein the second operating parameter is proportionately smaller than the first operating parameter by a ratio.

11. A ground fault detection system for an electrical connector providing power to a grounded aircraft, comprising:

a plug housing comprising an interior cavity;

a sensing device disposed within the interior cavity and electrically coupled to a plurality of power conductors, the plurality of conductors comprising:
a first power phase;
a second power phase;
a third power phase; and
a neutral line;

wherein the sensing device generates, based on a first operating parameter of the plurality of power conductors, a second operating parameter that is smaller than the first operating parameter; and a ground fault detection device comprising:
a signal conditioner measuring the second operating parameter generated by the sensing device; and
logic determining whether the second operating parameter exceeds a ground fault threshold.

12. The system of claim 11, wherein the logic of the ground fault detection device also sends, based on determining that the second operating parameter exceeds the ground fault threshold, a ground fault notification to a status indicator.

13. The system of claim 12, further comprising a plug housing having an interior cavity, wherein the sensing device and the ground fault detection device are disposed within the interior cavity of the plug housing.

14. The system of claim 13, wherein the plug housing comprises a removable adapter comprising:

a first end comprising a plurality of apertures that couple to a first plurality of pins of the plug housing; and a second opposing end comprising a second plurality of pins.

15. The system of claim 14, wherein the sensing device and the ground fault detection device are disposed inside the removable adapter.

16. The system of claim 14, wherein the first plurality of pins further comprises a instrumentation line, and wherein the ground fault detection device sends the ground fault notification using the instrumentation line.

17. The system of claim 11, wherein the sensing device is a current transformer, and wherein the second operating parameter is a current.

18. A method for detecting an overcurrent condition in an electrical connector providing power to a grounded aircraft, comprising:

receiving a first operating parameter for at least one of a plurality of power conductors;

generating a second operating parameter based on the first operating parameter;

measuring, for at least one of the plurality of power conductors, the second operating parameter; and determining whether the second operating parameter exceeds a current threshold.

19. The method of claim 18, further comprising the step of sending, based on a positive determination that the second operating parameter exceeds the current threshold, an overcurrent notification.

20. The method of claim 18, wherein a shunt generates the second operating parameter.

21. The method of claim 20, wherein the shunt is electrically coupled to each of the plurality of power conductors, and wherein the second operating parameter corresponds to a temperature of the shunt.

22. The method of claim 18, wherein a sensing device generates the second operating parameter and wherein the second operating parameter is proportionately smaller than the first operating parameter by a ratio.

23. The method of claim 22, wherein the second operating parameter is independent of a temperature of at least one of the plurality of power conductors.

24. The method of claim 18, further comprising:

measuring, for at least one of the plurality of power conductors, a third operating parameter generated by and measured at a shunt, wherein the third operating parameter corresponds to a temperature of the shunt;

determining, for at least one of the plurality of power conductors, a difference between the second operating parameter and the third operating parameter;

determining that the difference exceeds an operating threshold; and transmitting, based on determining that the difference exceeds the operating threshold, an overtemperature notification.

25. A method of detecting a ground fault of an electrical connector providing power to a grounded aircraft, comprising:

generating, based on a first operating parameter of each of a plurality of power conductors, a second operating parameter that is proportionately smaller than the first operating parameter by a ratio, wherein the plurality of power conductors comprises a first power phase, a second power phase, a third power phase, and a neutral line;

measuring the second operating parameter of each of the plurality of power conductors;

determining a difference in the second operating parameter for at least two of the plurality of power conductors; and determining that the difference in the second operating parameter for the at least two of the plurality of power conductors exceeds a ground fault threshold.

26. The method of claim 25, further comprising:

sending, based on determining that the difference exceeds the ground fault threshold, a ground fault notification to a status indicator 27. The method of claim 26, wherein generating the second operating parameter, measuring the second operating parameter, determining the difference, and sending the ground fault notification occurs inside a plug housing of the electrical connector.

\* \* \* \* \*